(12) United States Patent
Cadugan et al.

(10) Patent No.: US 11,296,247 B2
(45) Date of Patent: Apr. 5, 2022

(54) PHOTODETECTOR WITH A BURIED LAYER

(71) Applicant: Allegro MicroSystems, LLC, Manchester, NH (US)

(72) Inventors: Bryan Cadugan, Bedford, NH (US); Harianto Wong, Southborough, MA (US); William P. Taylor, Amherst, NH (US)

(*) Notice: Subject to any disclaimer, the term of this patent is extended or adjusted under 35 U.S.C. 154(b) by 0 days.

(21) Appl. No.: 16/272,005

(22) Filed: Feb. 11, 2019

(65) Prior Publication Data
US 2020/0259026 A1    Aug. 13, 2020

(51) Int. Cl.
*H01L 31/0352* (2006.01)
*H01L 31/18* (2006.01)
*H01L 31/105* (2006.01)

(52) U.S. Cl.
CPC .... *H01L 31/03529* (2013.01); *H01L 31/1055* (2013.01); *H01L 31/1804* (2013.01)

(58) Field of Classification Search
CPC .......... H01L 31/03529; H01L 31/1804; H01L 31/1055; H01L 21/74; H01L 31/02162; H01L 27/1446; H01L 31/02161; H01L 31/107; H01L 31/035272; H01L 31/105
See application file for complete search history.

(56) References Cited

U.S. PATENT DOCUMENTS

| | | | |
|---|---|---|---|
| 4,264,382 A * | 4/1981 | Anantha | H01L 21/3065 257/511 |
| 6,020,623 A * | 2/2000 | Chiozzi | H01L 27/0783 257/162 |
| 6,034,413 A * | 3/2000 | Hastings | H01L 27/0623 257/197 |
| 6,828,644 B2 * | 12/2004 | Asano | H01L 21/761 257/461 |
| 7,397,101 B1 * | 7/2008 | Masini | H01L 31/028 257/184 |
| 8,384,183 B2 | 2/2013 | Wong et al. | |
| 9,099,638 B2 | 8/2015 | Wang et al. | |
| 9,312,473 B2 | 4/2016 | Kosier et al. | |
| 9,548,443 B2 | 1/2017 | Wang | |
| 2004/0173875 A1 * | 9/2004 | Yamamoto | H01L 29/735 257/565 |

(Continued)

OTHER PUBLICATIONS

U.S. Appl. No. 16/740,816, filed Jan. 13, 2020, Cadugan et al.

(Continued)

*Primary Examiner* — Julia Slutsker
(74) *Attorney, Agent, or Firm* — Daly, Crowley, Mofford & Durkee, LLP (57) ABSTRACT

An electronics module assembly for detecting photons is provided to include: a substrate layer; a buried layer deposited upon a first surface area of the substrate layer; an intrinsic layer deposited upon a first portion of a first surface area of the buried layer; a plug layer deposited upon a second portion of the first surface area of the buried layer; a p-plus layer deposited upon a first surface area of the intrinsic layer; an n-plus layer deposited upon a first surface area of the plug layer; a pre-metal dielectric (PMD) layer deposited upon the p-plus layer and n-plus layer; a first node coupled, through the PMD layer, to the p-plus layer; and a second node coupled, through the PMD layer, to the n-plus layer.

19 Claims, 7 Drawing Sheets

(56) References Cited

U.S. PATENT DOCUMENTS

| | | |
|---|---|---|
| 2005/0184354 A1 | 8/2005 | Chu et al. |
| 2007/0170537 A1* | 7/2007 | Poenar ............... H01L 31/1884 |
| | | 257/462 |
| 2008/0083963 A1 | 4/2008 | Hsu et al. |
| 2019/0288132 A1* | 9/2019 | Wang ................... H01L 31/103 |
| 2020/0259038 A1* | 8/2020 | Natsuaki ............ H01L 31/0284 |

OTHER PUBLICATIONS

Lee et al., "A Miniaturized High-Voltage Solar Cell Array as an Electrostatic MEMS Power Supply;" Journal of Microelectromechanical Systems, vol. 4, No. 3; Sep. 1995; 7 Pages.

Response to U.S. Non-Final Office Action dated Nov. 25, 2020 for U.S. Appl. No. 16/740,816; Response filed on Feb. 24, 2021; 10 pages.

Restriction Requirement dated Oct. 28, 2020 for U.S. Appl. No. 16/740,816; 7 pages.

Response to Restriction Requirement dated Nov. 4, 2020 for U.S. Appl. No. 16/740,816; 1 page.

U.S. Non-Final Office Action dated Nov. 25, 2020 for U.S. Appl. No. 16/740,816; 14 pages.

U.S. Final Office Action dated May 11, 2021 for U.S. Appl. No. 16/740,816; 14 pages.

Response to Final Office Action dated May 11, 2021 and filed on Aug. 11, 2021 for U.S. Appl. No. 16/740,816; 9 pages.

Response to Final Office Action filed Aug. 11, 2021 for U.S. Appl. No. 16/740,816; 9 Pages.

Notice of Allowance dated Aug. 26, 2021 for U.S. Appl. No. 16/740,816; 11 Pages.

\* cited by examiner

PHOTODETECTOR WITH A BURIED LAYER

BACKGROUND

As is known in the art, there are two conventional approaches to create a Photodiode (or Silicon Photodiode). The first approach is using a vertical process that requires a top and bottom contact and allows for a thick vertical region to improve the PDE (Photon Detection Efficiency). A limitation of the first approach is that it does not allow for CMOS (Complementary metal-oxide-semiconductor) integration or multipixel designs on one die. The other approach is a CMOS compatible process that allows for good, inexpensive integration. However, the second approach does not allow for a very thick vertical region causing PDE to be sacrificed.

SUMMARY

In accordance with the concepts, techniques and systems described herein is an efficient method for creating a photodetector using an epitaxial (EPI) growth and buried layer process.

According to one illustrative embodiment, an electronics module assembly may include: a substrate layer; a buried layer deposited upon a first surface area of the substrate layer; an intrinsic layer deposited upon a first portion of a first surface area of the buried layer; a plug layer deposited upon a second portion of the first surface area of the buried layer; a p-plus layer deposited upon a first surface area of the intrinsic layer; an n-plus layer deposited upon a first surface area of the plug layer; a pre-metal dielectric (PMD) layer deposited upon the p-plus layer and n-plus layer; a first node coupled, through the PMD layer, to the p-plus layer; and a second node coupled, through the PMD layer, to the n-plus layer.

In one aspect, the electronics module assembly may further include one or more trenches spanning multiple layers from the PMD layer to the buried layer at outer sides of the p-plus layer and n-plus layer. Herein, one of the one or more trenches may be located between the p-plus layer and n-plus layer.

In one aspect, the substrate layer may comprise a p-type substrate.

In one aspect, the buried layer may comprise an n-type buried layer (NBL).

In one aspect, the electronics module assembly may further include an n-type epitaxial (N-EPI) layer deposited between the first surface area of the intrinsic area and a second surface area of the p-plus layer, wherein the intrinsic layer comprises a material other than epitaxial (EPI).

In one aspect, a portion of a surface area of the PMD layer may be configured to receive a photon.

In one aspect, a portion of a second surface area of the substrate layer may be configured to receive a photon.

In one aspect, the plug layer may puncture the buried layer.

In one aspect, more than one electronics module assemblies may form an array comprising the more than one electronics module assemblies.

According to another illustrative embodiment, a method for forming an electronics module assembly may include: depositing a buried layer upon a first surface area of a substrate layer; depositing an intrinsic layer upon a first portion of a first surface area of the buried layer; depositing a plug layer upon a second portion of the first surface area of the buried layer; depositing a p-plus layer upon a first surface area of the intrinsic layer; depositing an n-plus layer upon a first surface area of the plug layer; depositing a pre-metal dielectric (PMD) layer upon the p-plus and n-plus layer; coupling a voltage node, through the PMD layer, to the p-plus layer; and coupling a ground node, through the PMD layer, to the n-plus layer.

In one aspect, the method may further include forming a portion of a surface area of the PMD layer to receive a photon.

In one aspect, the method may further include forming a portion of a second surface area of the substrate layer to receive a photon.

In one aspect, the method may further include implanting one or more trenches at outer sides of the p-plus layer and n-plus layer, each of the more than one trench spanning multiple layers from the PMD layer to the buried layer. Herein, one of the one or more trenches may be located between the p-plus layer and n-plus layer.

In one aspect, the method may further include depositing an n-type epitaxial (N-EPI) layer between the first surface area of the intrinsic area and a second surface area of the p-plus layer, wherein the intrinsic layer comprises a material other than epitaxial (EPI).

In one aspect, the plug layer may puncture the buried layer.

In one aspect, the method may further include forming an array of electronics module assemblies using more than one electronics module assemblies.

The details of one or more embodiments of the disclosure are outlined in the accompanying drawings and the description below. Other features, objects, and advantages of the disclosure will be apparent from the description and drawings, and the claims.

BRIEF DESCRIPTION OF THE DRAWINGS

The foregoing features may be more fully understood from the following description of the drawings in which.

DETAILED DESCRIPTION

Relative descriptions herein, such as left, right, up, and down, are with reference to the figures, are merely relative and not meant in a limiting sense. Unless otherwise specified, the illustrated embodiments may be understood as providing illustrative features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

For convenience, certain introductory concepts and terms used in the specification are collected here.

As used herein, the term the term "Photodetector" is used to describe a part or device that detects a photon from gain generated by electron-hole pairs from the photon. The photodetector may comprise a PIN (Ptype/Intrinsic/Ntype) Photodiode, APD (Avalanche photodiode) or SPAD (Single Photon Avalanche Photo Diode). Herein, the term APD or SPAD is used to describe a silicon-based semiconductor that provides gain by the generation of electron-hole pairs from a photon. The electron-hole pairs create an "avalanche" of electrons in a substrate. The diode conventionally contains a pn junction comprising a positively doped p-region and a negatively doped n-region, where a depletion region exists between the p-region and n-region. The APD is biased near breakdown and receives an avalanche multiplier. The SPAD is biased above breakdown and triggers the short duration relatively large avalanche current. The PIN Photodiode gets a mild bias and no avalanche amplification.

As used herein, the term "substrate" is used to describe any type of structure with a flat surface upon which semiconductor materials can be deposited and/or into which semiconductor materials can be implanted and/or diffused. In some embodiments, the substrate is a P-type silicon substrate having a particular range of concentrations of P-type atoms (i.e., ions).

As used herein, the term "epi" is used to refer to an epitaxial layer, for example, an N-type epitaxial layer, disposed over a substrate, for example, a P-type substrate, and having a particular range of concentrations of N-type atoms (i.e., ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e., ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after the PBL implant and diffusion steps, and the upward diffusion into the epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after the NBL implant and diffusion steps, and the upward diffusion into the epi layer can be performed during a field oxidation process.

As used herein, the term "plug" is used to refer to a low resistance vertical connection between different layers in the multilevel interconnect scheme. Tungsten (W) may be used for this purpose, but other suitable materials can be used.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e., ions).

Figure 1:
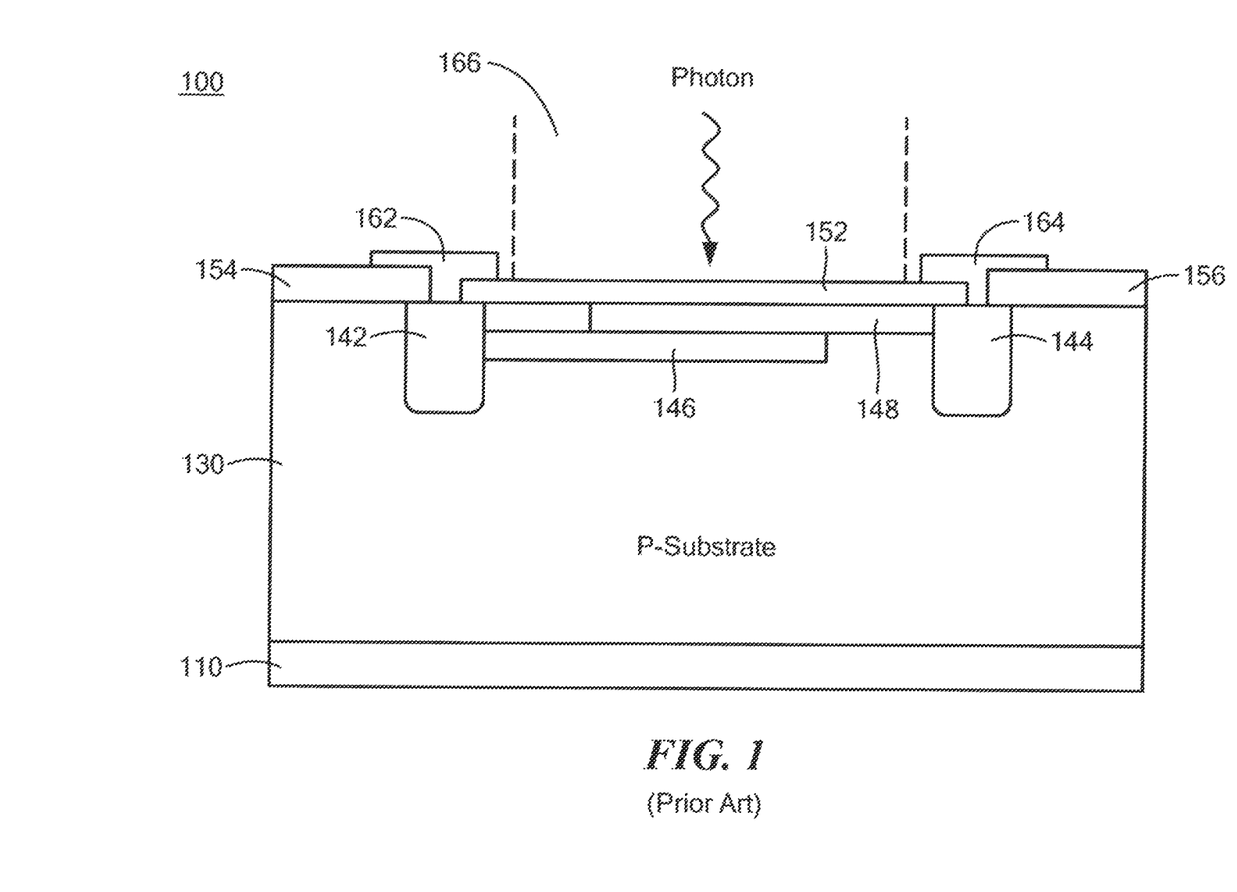
FIG. 1 is a block diagram of a conventional Single Photon Avalanche Photo Diode (SPAD) as an example of a Photodiode.

Referring now to FIG. 1, a diagram showing a conventional structure of Single Photon Avalanche Photo Diode (SPAD). A photon entering the SPAD 100 may pass through a silicon dioxide layer 152. In some embodiments, the SPAD may have an anti-reflecting coating. The photon then reaches an n layer 148 and an upper p layer 146 where the photon excites free electrons and holes. The electrons and holes then move up to an anode 162 and a cathode 164. The region of the optimal creation of electron/hole pairs occurs in a depletion region 146/148. However, the thin depletion region is less efficient for the detection of long wavelength light. The wavelength of the photon is commonly 905 nm. For photons with 905 nm wavelength, the Photon Detection Efficiency (PDE) is less than <2% for a CMOS compatible process.

Figure 2:
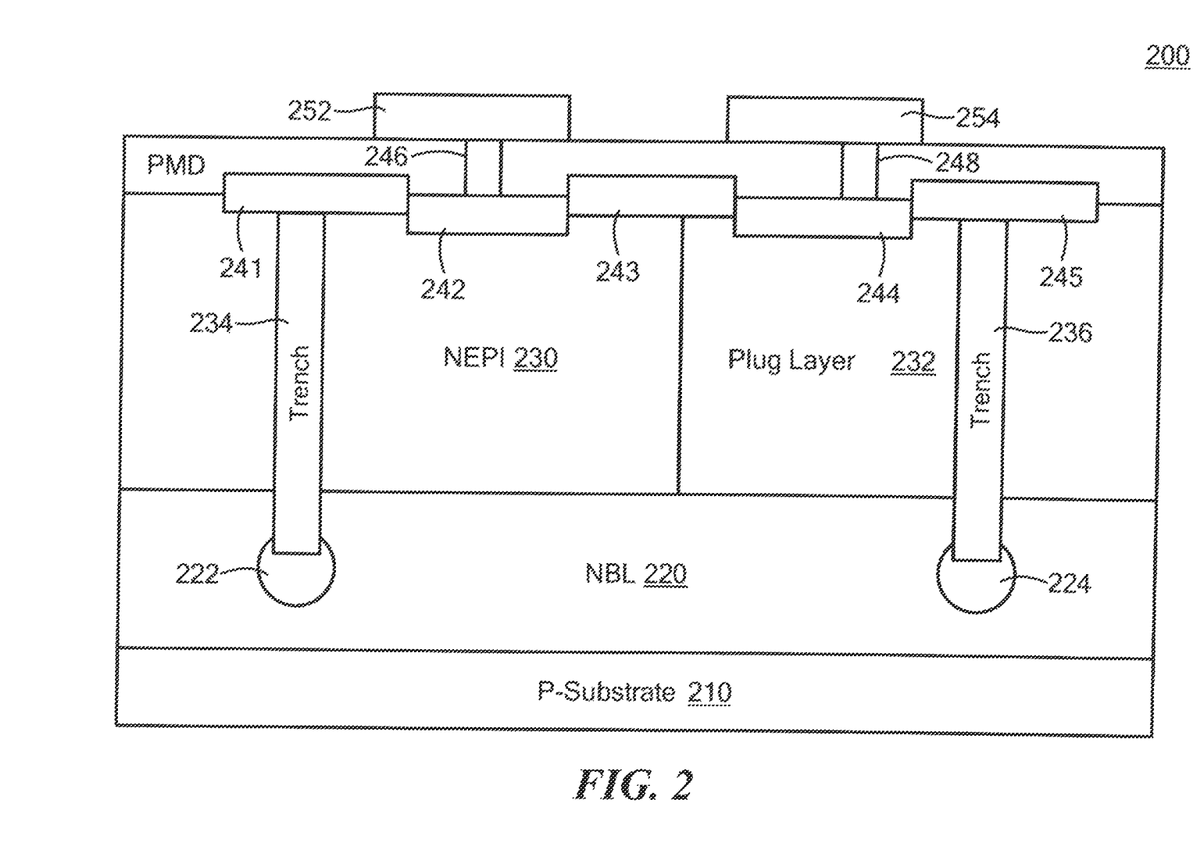
FIG. 2 is a diagram showing an illustrative CMOS device built with a buried layer process.

Referring now to FIG. 2, a diagram showing an illustrative device built with a buried layer process is presented. The technology of the buried layer process is described, for example, in U.S. Pat. Nos. 5,514,901 and 5,545,917. The buried layer process may include, but is not limited to, these steps: 1) a standard p-substrate has "buried" layers—N-type or P-type disposed on the p-substrate; 2) an EPI layer is grown, effectively burying the buried layers; and 3) a plug layer can be implanted and driven to connect buried layers to top layers, this plug layer is commonly an N-type, but can be P-type as well. By using the buried layer process, a very highly doped lower layer would be connected to the top layer, for example, a Voltage at the Common Collector (VCC) node on the top layer, through the plug layer, which may be heavily doped and diffuses up and down through the EPI layer.

The illustrative device 200 may be a BCD (Bipolar-CMOS-DMOS, or BCD) device. The device 200 may comprise a P-type silicon substrate (or p-substrate) 210. On a surface of the p-substrate, an N-type buried layer or NBL 220 is implanted. Over the NBL, an N-type EPI layer (or N-EPI) 230 may be grown next to an implanted plug layer. The device may have an anode 252 and cathode 254 to interface with other modules. Through the anode 252, current flows into the device from outside, and through the cathode 254, current flows out from the device. The anode 252 may be connected by metal 246 to a P-type plus (or p-plus) region 242. The p-plus region is deposited on top of N-EPI 230. In some embodiments, the p-plus region 242 may be highly doped, and the N-EPI layer 230 may be weakly doped. In other embodiments when a p-type plug 232 is used, the p-plus region 242 and n-plus region 244 may be switched. The cathode 254 may be connected to N-type plus (or n-plus) region 244 by metal 248. The n-plus region 244 is deposited on top of the plug layer 232, which is connected to the NBL 220. In some embodiments, the plug layer 232 is a highly conductive N doped Plug, and the NBL layer 220 is highly conductive. Furthermore, the device may be isolated using one or more deep trenches 234, 236, which may be filled with oxide. In some embodiments, the trenches are located on both sides of the device. In other embodiments, field oxide (FOX) 241, 243, 245 that are filled with oxide may be added to provide lateral isolation. Herein, there may be space between the FOX 241, 243, 245 and n-plus region 242 and p-plus region 244.

This buried layer process allows for the EPI to become a more intrinsic type compound that is better optimized for photodetection when compared to a more standard CMOS process. The buried process allows that the EPI to have a thicker intrinsic region, while the CMOS process allows having a thin region created by the natural diffusion. The thicker EPI enables more efficient detection of longer wavelengths such as 905 nm. With this technology, creating an area for photon detection may be achieved without relying on the creation of a depletion region. The technology may also allow the device to have a topology that is similar to a standard vertical APD as shown in FIG. 1. Furthermore, this silicon EPI process may allow driving the device at 60V or above, which allows managing the increased breakdown voltage coming from a thick vertical device as a result of the EPI process. In some embodiments, the thickness of the EPI layer, created using the technology described herein, may be greater than 8 um, and in an embodiment ranges from about 11-13 um, which is thicker than a corresponding layer in the conventional APD shown in FIG. 1. Another embodiment may have a silicon EPI thickness of 10 to 15 um.

As known in the art, photons with shorter wavelengths are absorbed more rapidly into the material. Accordingly, electron/hole pairs from the shorter-wavelengths photons may be created in a thin layer. Conversely, a photodetector with a thicker layer is needed to detect longer-wavelengths photons. For example, for 905 nm photons in a Light Detection and Ranging (LIDAR), it will take about 30 um for 63% of LIDAR photons to be absorbed. As can be appreciated by those of ordinary skill in the relevant art, the property would differ based on the material type that is used.

The thickness of the EPI layer and the possibility of using other materials instead of EPI may allow detecting photons having a longer wavelength. Furthermore, through the optimization of the inventive concept described herein, it may be possible to absorb photons in an upper layer that does not contribute to the avalanche effect. This ability to absorb photons in an upper layer may allow filtering the visible light "noise" before electron-hole pairs are created in the intrinsic region for the longer-wavelength photons. In some embodiments, a normal layer of n-type silicon may be deposited on top of this intrinsic layer. This structure may allow for better process compatibility with most of the CMOS devices having a thin top EPI layer. This buried EPI layer process may be applied to a photodetector will be described in detail at least in conjunction with FIGS. 3-5.

Figure 3:
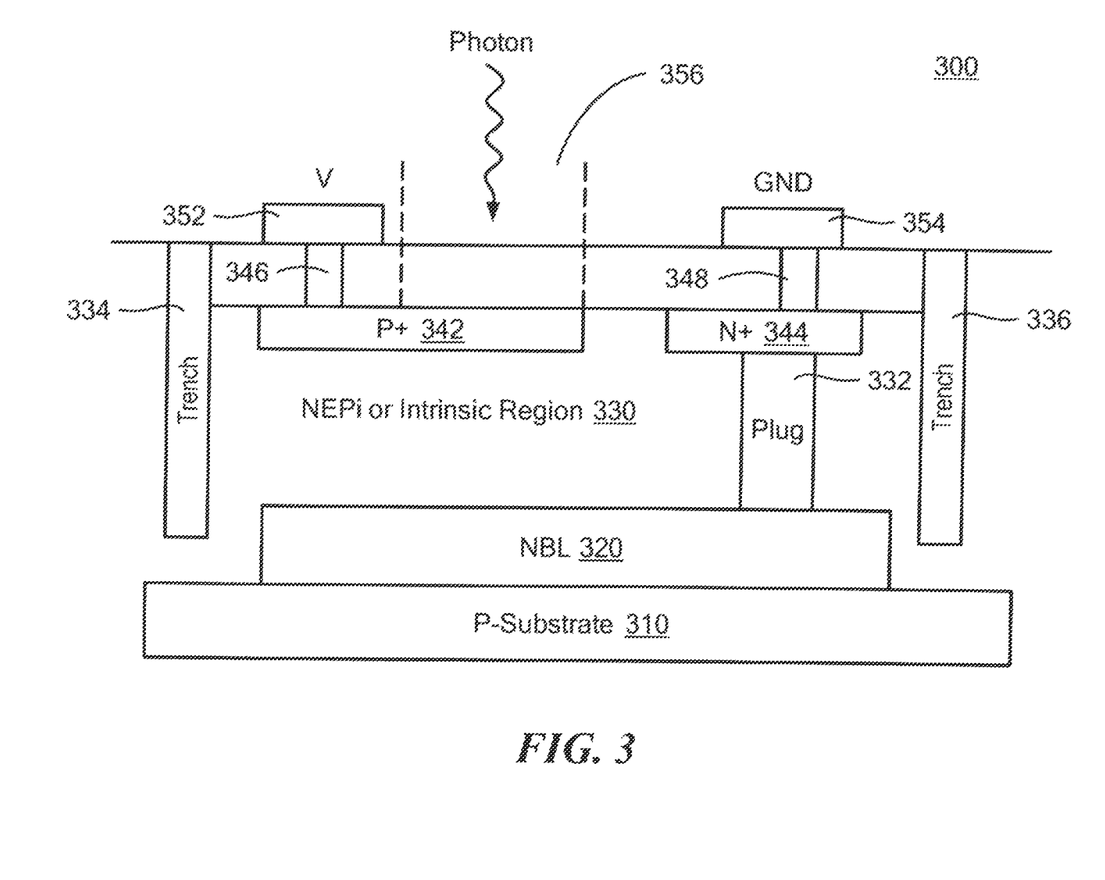
FIG. 3 is a diagram showing an illustrative Photodiode using EPI growth and buried layer process according to the concepts described herein.

Referring now to FIG. 3, a diagram showing a photodetector 300 using EPI growth and buried layer process is presented. The photodetector 300 may include an NBL 320 that is deposited on (or buries) a p-substrate 310. On top of the NBL 320, an N-EPI layer 330 may be grown to bury the NBL 320. In some embodiments, the N-EPI 330 may comprise an intrinsic region comprising the silicon EPI. A plug layer 332 may be implanted and driven to connect the NBL 320 to top layers. A P-type plus (or "p-plus") region 342 and an N-type plus (or "n-plus") region 344 may be deposited on top of the N-EPI layer 330. The n-plus region 344 is coupled to the plug layer 332. A voltage node (or "V-node") 352 and a ground node (or "GND-node") 354 may be deposited on top of the device 300. The V-node 352 and GND-node 354 are coupled, with metal 346, 348, to the p-plus 342 and n-plus 344 respectively. Herein, the combination of NBL 320, EPI layer 330, p-plus 342, and V-node 352 may be considered as a photodetector "cell." A photon-detection area 356 is formed for the cell on a surface of the photodetector. In some embodiments, one or more trenches 334, 336 may be implanted at each side to isolate each cell of the photodetector. In some embodiments, the trenches 334, 336 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material.

The path from GND 354 to NBL 320 through metal 348 and plug 332 provides an efficient way to bias the bottom (NBL and/or P-substrate) of the SPAD 300 without making direct contact to the bottom of the device 300. Another approach to contact the bottom of the device would be to thin the wafer thickness by reducing the substrate thickness. In embodiments, the substrate thickness may be reduced through CMP (chemical mechanical polish) process with the wafer or die before assembly into a package. Using the buried layer approach described herein may achieve the desired characteristics without complex processing required in conventional photodetectors.

In some embodiments, the p-plus region 342 may be optimized in combination with the N-EPI layer 330 to achieve desired characteristics as a photodetector. The region of photosensitivity 356 is the area where the incident photons (i.e., light) can impact the surface. The photons reach the NEPI layer 330 and create electron/hole pairs. The electron/hole pairs then create current up through the p-plus region 342 and down through the NBL 320. The current then goes up to GND 354 through the plug 332, n-plus region 344 and metal 348. Herein, the distance between the p-plus 342 and n-plus 344 may be optimized to avoid any lateral bias in the substrate 310. In embodiments, the distance is farther than the thickness of the N-EPI layer 330. In some embodiments, the EPI layer 330 may be a P-type. The type of the EPI layer is decided from the dopants or majority carriers within the EPI when it is grown. The 'N' or 'P' type will influence how the EPI layer can be used in transistor circuits and how it creates diffusion regions when abutted against another region. For example, N-type semiconductors have excess electron carriers, while p-type have excess hole carriers (positive charge carriers). In other embodiments, the NBL-plug 330, 332 path may be highly doped and comprise a P-type material.

Figure 3A:
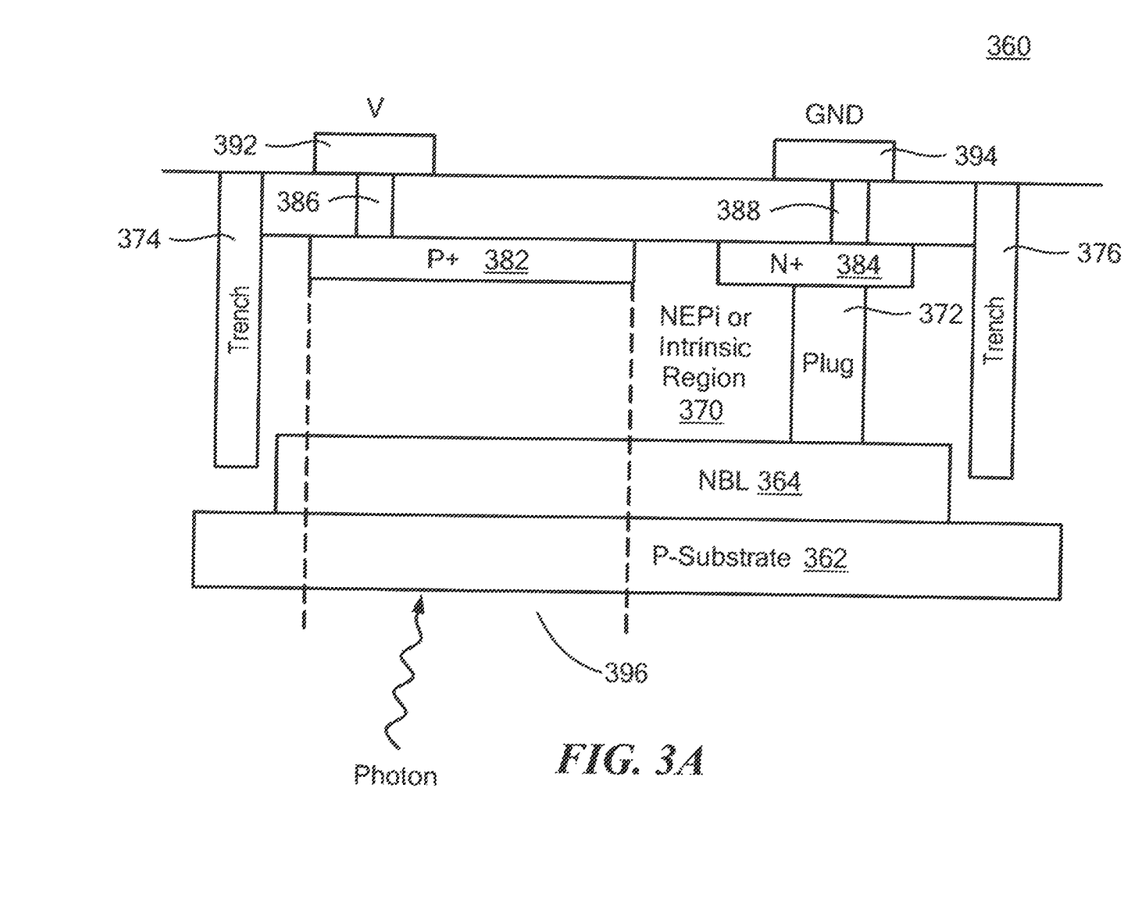
FIG. 3A is a diagram showing an illustrative Photodiode using EPI growth and buried layer process with Backside Illuminated (BSI) approach according to the concepts described herein.

Referring now to FIG. 3A, a diagram showing an illustrative photodetector 360 using Backside-Illuminated (BSI) approach is presented. The photodetector 360 may include an NBL 364 that is deposited on (or buries) a p-substrate 362. On top of the NBL 364, an N-EPI or intrinsic layer 370 may be grown to bury the NBL 364. A plug layer 372 may be implanted and driven to connect the NBL 364 to top layers. A p-plus region 382 and an n-plus region 384 may be deposited on top of the N-EPI layer 370. The nplus region 384 is coupled to the plug layer 372. A V-node 392 and a GND-node 394 may be deposited on top of the device 360. The V-node 392 and GND-node 394 are coupled, with metal 386, 388, to the p-plus 382 and n-plus 384 respectively. In some embodiments, one or more trenches 374, 376 may be implanted at each side to isolate these components. In some embodiments, the trenches 374, 376 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material.

In contrast to a front-illuminated or frontside-illuminated photodetector (e.g., 300 in FIG. 3), a backside-illuminated (BSI) photodetector 360 may receive photons through a photosensitivity region 396 formed at the backside of the photodetector. The back-illuminated photodetector 360 may contain the same elements as the front-illuminated photodetector 300, but the elements may be arranged differently. Accordingly, the photons may strike the EPI layer 370 without passing through the wiring layer, such as the V-node 392 that may reflect some of the incoming photons. Therefore, the BSI photodetector 360 may capture incoming photons with a higher probability than the front-illuminated photodetector. In the present specification, one illustrated BSI photodetector 360 is shown. However, as can be appreciated by those of ordinary skill in the pertinent art, other structures (e.g., 400 in FIGS. 4 and 500 in FIG. 5) also may be changed to support the BSI approach.

Figure 4:
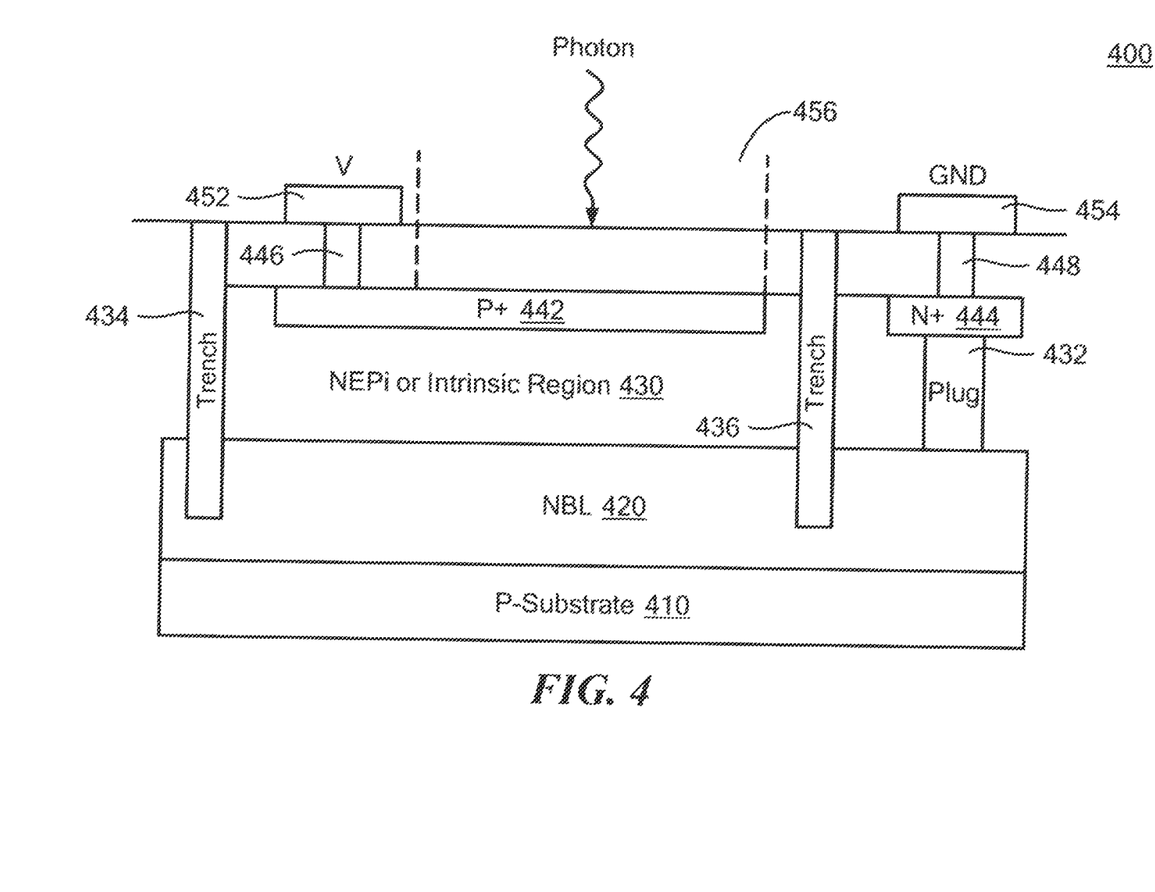
FIG. 4 is a diagram showing another illustrative Photodiode using EPI growth and buried layer process according to the concepts described herein.

Referring now to FIG. 4, a diagram showing another illustrative embodiment of a photodetector 400 is presented. The photodetector 400 may include an NBL 420 that is deposited on (or buries) a p-substrate 410. On top of the NBL 420, an EPI layer 430 may be grown to bury the NBL 420. A plug layer 432 may be implanted and driven to connect the NBL 420 to top layers. A p-plus region 442 and an n-plus region 444 may be deposited on top of the EPI layer 430. The n-plus region 444 is coupled to the plug layer 432. A V-node 452 and a GND-node 454 may be deposited on top of the device 400. The V-node 452 and GND-node 454 are coupled, with metal 446, 448, to the p-plus 442 and n-plus 444 respectively. A photon-detection area 456 is formed on a top surface of the photodetector. Herein, one or more trenches 434, 436 may puncture the NBL 420 and allow the GND return path (NBL 420-plug 442-n-plus 344-GND 454) to be outside of one of the trenches. In some embodiments, the trenches 434, 436 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material. This structure may enable that more than one photodetector cell share a common ground return path. Sharing a ground return path by more than one photodetector cell may allow a more densely packed array of photo-detector cells and a higher level of photo-sensitive top area.

Figure 5:
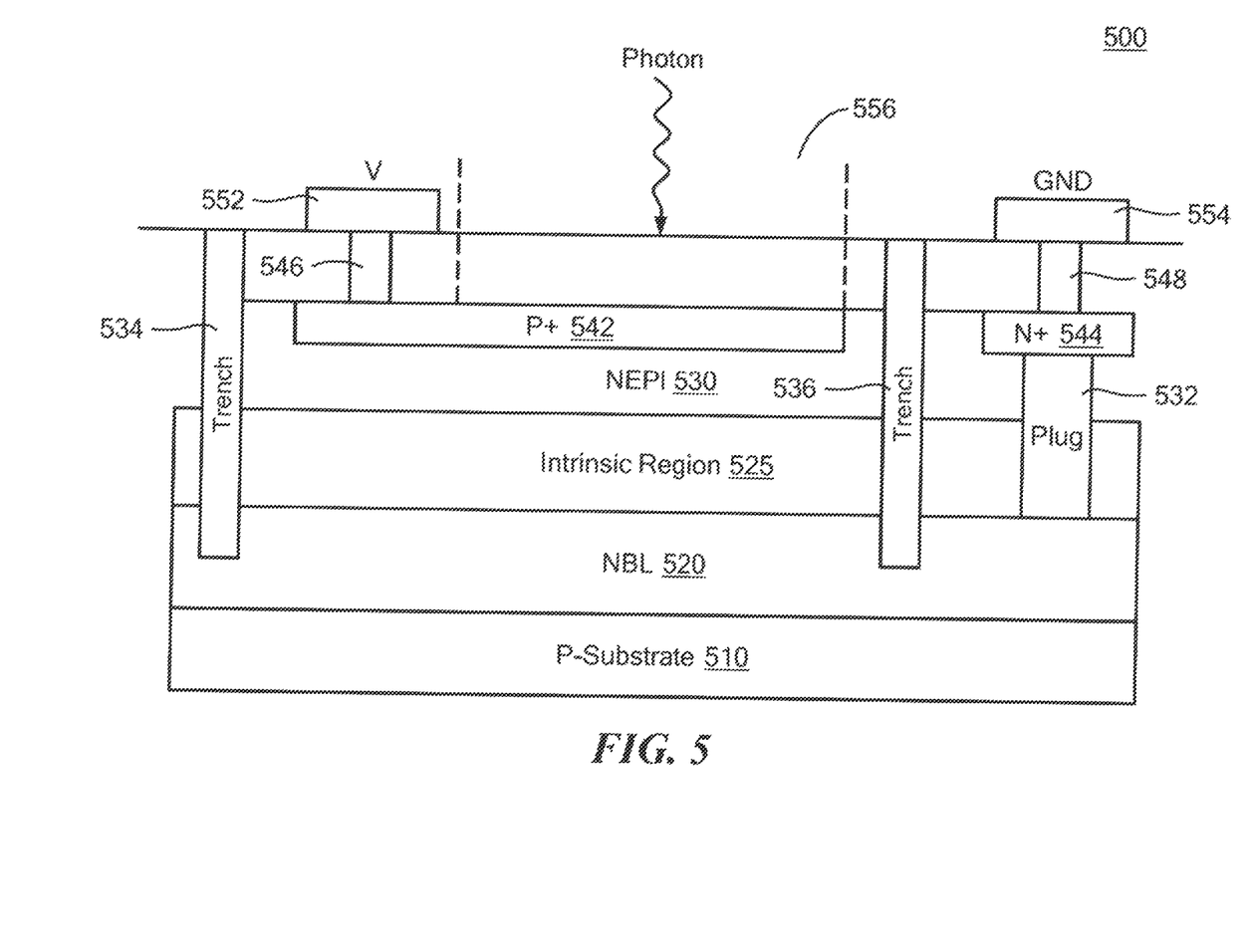
FIG. 5 is a diagram showing an illustrative hybrid Photodiode using buried layer process according to the concepts described herein.

Referring now to FIG. 5, a diagram showing an illustrative embodiment of a hybrid photodetector 500 is presented. The photodetector 500 may include an NBL 520 that is deposited on (or buries) a p-substrate 510. Instead of depositing an EPI layer on top of the NBL 520 directly, an intrinsic layer 525 may be deposited. This structure may be used when the chosen intrinsic material cannot be used for standard CMOS silicon. On top of the intrinsic layer 525, an EPI layer 530 may be deposited. A plug layer 532 may be implanted and driven to connect the NBL 520 to top layers, crossing the intrinsic layer 525. A p-plus region 542 and an n-plus region 544 may be deposited on top of the EPI layer 530. The n-plus region 544 is coupled to the plug layer 532. A V-node 552 and a GND-node 554 may be deposited on top of the device 500. The V-node 552 and GND-node 554 are coupled, with metal 546, 548, to the p-plus 542 and n-plus 544 respectively. A photon-detection area 556 is formed on a top surface of the SPAD 500. In some embodiments, one or more trenches 534, 536 may puncture the NBL 520 to isolate a SPAD cell.

This structure of having an N-EPI layer 530 on top of additional intrinsic layer 525 may allow a normal device to be implanted into the N-EPI and enable that a more exotic material can be used for the intrinsic region to detect the incident photons. The more exotic materials may have a lower "energy-gap or band-gap," which allows for the creation of an electron/hole pair with a lower energy level. Higher wavelength photons have a lower energy level, which makes it impossible to form an electron/hole pairs without a material that has a lower "band-gap." Accordingly, being able to use more exotic materials could be effective for detecting longer-wavelength photons.

Figure 6:
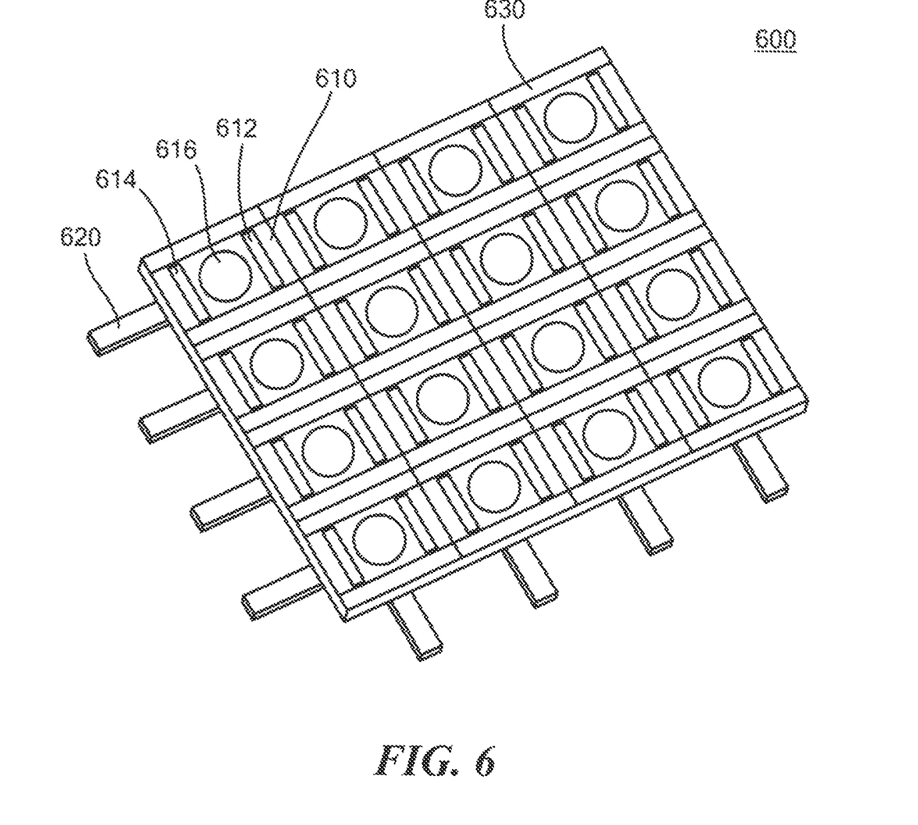
FIG. 6 is a diagram showing an illustrative multi-cell array of Photodiodes according to the concepts described herein.

Referring now to FIG. 6, more than one photodetector may be combined to create a multi-cell photodetector array 600. The photodetector cell may comprise an area for photon-sensing and other related materials/parts to process received photon and generate corresponding signals. In an illustrative embodiment, each of the cells 610 of the photon-detector array comprises a photodetector. Each photodetector 610 may have a photon-detection area 616 and a plurality of nodes 612, 614. The plurality of nodes 612, 614 in each cell may be connected using inter-cell connectors 630. The photon-detectors array may be connected to other components using a plurality of nodes 620 for the array 600. By combining multiple-cells in a single assembly, the overall PDE of the assembly may be increased, but not necessarily for individual cells of the assembly.

By using the concepts described herein, the photodetector created using the EPI growth and buried layer process may enable both dense integration of cells and a much thicker vertical region to improve Photon Detection Efficiency (PDE). A photodetector created using the concepts described herein may enable detecting a photon that has a long wavelength in a multi-cell array. The buried layer process enable a better connection from the top layer to the bottom layer with a low resistance path without having to thin the wafer. Furthermore, with a combination of the buried layer and trench, a plurality of individual cells may be created by varying the trench depth.

In an illustrative embodiment, a photodetector with an n-type EPI layer having a thickness of 11 um to 13 um, which is thicker than the ones from conventional technologies may provide a PDE of about 50%. In contrast, a conventional Silicon photomultiplier (SiPM) has a PDE of about 7% for 905 nm. This alternative option provides manufacturing flexibility and different characteristics for the photodetector. In addition, it is also possible to place a layer of standard EPI on top of the intrinsic layer.

One or more trenches comprising various materials may block cross triggering of adjacent photodetector cells. The depth of the trenches may be adjusted to create different cell arrangements, such as separating grounds or having common grounds across certain cell groups. Furthermore, patterned backside metal may be used to connect individual cells on the back-side, rather than connecting them all in common. By isolating photon-detection cells through the full thickness of the device, it is possible to connect using backside connections.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:
1. A photodetector comprising:
a substrate layer;
a buried layer deposited upon a first surface area of the substrate layer;
an epitaxial layer deposited upon a first portion of a first surface area of the buried layer, wherein the epitaxial layer includes an intrinsic region;
a plug layer deposited upon a second portion of the first surface area of the buried layer, wherein the epitaxial layer and the plug layer are adjacent to each other on the first surface area of the buried layer;
a p-plus layer deposited upon a first surface area of the epitaxial layer opposite from the first surface area of the buried layer;
an n-plus layer deposited upon a first surface area of the plug layer opposite from the first surface area of the buried layer;
a pre-metal dielectric (PMD) layer deposited upon a first surface area of the p-plus layer opposite from the first surface area of the epitaxial layer and upon a first surface area of the n-plus layer opposite from the first surface area of the plug layer;
a first node coupled, through the PMD layer, to the p-plus layer, wherein at least a portion of the p-plus layer is not covered by the first node and wherein the at least a portion of the p-plus layer not covered by the first node corresponds to a photon-detection area of the photodetector; and
a second node coupled, through the PMD layer, to the n-plus layer.

2. The photodetector of claim 1, further comprising:
one or more trenches spanning multiple layers from the PMD layer to the buried layer at outer sides of the p-plus layer and n-plus layer.

3. The photodetector of claim 2, wherein one of the one or more trenches is located between the p-plus layer and n-plus layer.

4. The photodetector of claim 1, wherein the substrate layer comprises a p-type substrate.

5. The photodetector of claim 1, wherein the buried layer comprises an n-type buried layer (NBL).

6. The photodetector of claim 1, wherein the epitaxial layer comprises n-type epitaxial (N-EPI) silicon.

7. The photodetector of claim 1, wherein a portion of a surface area of the PMD layer is configured to receive a photon.

8. The photodetector of claim 1, wherein a portion of a second surface area of the substrate layer is configured to receive a photon.

9. The photodetector of claim 1, wherein the plug layer punctures the buried layer.

10. The photodetector of claim 1, wherein more than one electronics module assemblies form an array comprising the more than one electronics module assemblies.

11. A method for forming a photodetector, the method comprising:
depositing a buried layer upon a first surface area of a substrate layer;
depositing an epitaxial layer upon a first portion of a first surface area of the buried layer, wherein the epitaxial layer and the plug layer are adjacent to each other on the first surface area of the buried layer;
depositing a plug layer upon a second portion of the first surface area of the buried layer;
depositing a p-plus layer upon a first surface area of the epitaxial layer opposite from the first surface area of the buried layer;
depositing an n-plus layer upon a first surface area of the plug layer opposite from the first surface area of the buried layer;
depositing a pre-metal dielectric (PMD) layer upon a first surface area of the p-plus opposite from the first surface area of the epitaxial layer and upon a first surface area of the n-plus layer opposite from the first surface area of the plug layer;
coupling a voltage node, through the PMD layer, to the p-plus layer, wherein at least a portion of the p-plus layer is not covered by the voltage node and wherein the at least a portion of the p-plus layer not covered by the first node corresponds to a photon-detection area of the photodetector; and
coupling a ground node, through the PMD layer, to the n-plus layer.

12. The method of claim 11, further comprising:
forming a portion of a surface area of the PMD layer to receive a photon.

13. The method of claim 11, further comprising:
forming a portion of a second surface area of the substrate layer to receive a photon.

14. The method of claim 11, further comprising:
implanting one or more trenches at outer sides of the p-plus layer and n-plus layer, each of the one or more trenches spanning multiple layers from the PMD layer to the buried layer.

15. The method of claim 14, wherein one of the one or more trenches is located between the p-plus layer and n-plus layer.

16. The method of claim 11, further comprising:
depositing an n-type epitaxial (N-EPI) layer between the first surface area of the intrinsic layer and a second surface area of the p-plus layer, wherein the intrinsic layer comprises a material other than epitaxial (EPI).

17. The method of claim 11, wherein the plug layer punctures the buried layer.

18. The method of claim 11, further comprising:
forming an array of electronics module assemblies using more than one electronics module assemblies.

19. The photodetector of claim 1, wherein the first node and the second node correspond to a voltage node and a ground node, respectively, of a photodiode.

* * * * *

UNITED STATES PATENT AND TRADEMARK OFFICE
CERTIFICATE OF CORRECTION

PATENT NO. : 11,296,247 B2  
APPLICATION NO. : 16/272005  
DATED : April 5, 2022  
INVENTOR(S) : Bryan Cadugan et al.

Page 1 of 1

It is certified that error appears in the above-identified patent and that said Letters Patent is hereby corrected as shown below:

On the Title Page

Add item (73) Assignee; Allegro MicroSystems, LLC, Manchester, NH (US)

Signed and Sealed this  
Sixth Day of December, 2022

Katherine Kelly Vidal  
*Director of the United States Patent and Trademark Office*